United States Patent

Fujikura

(10) Patent No.: US 10,978,294 B2
(45) Date of Patent: *Apr. 13, 2021

(54) SEMI-INSULATING CRYSTAL, N-TYPE SEMICONDUCTOR CRYSTAL AND P-TYPE SEMICONDUCTOR CRYSTAL

(71) Applicants: SCIOCS COMPANY LIMITED, Ibaraki (JP); SUMITOMO CHEMICAL COMPANY, LIMITED, Tokyo (JP)

(72) Inventor: Hajime Fujikura, Ibaraki (JP)

(73) Assignees: SCIOCS COMPANY LIMITED, Ibaraki (JP); SUMITOMO CHEMICAL COMPANY, LIMITED, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/344,118

(22) PCT Filed: Jul. 13, 2017

(86) PCT No.: PCT/JP2017/025552
§ 371 (c)(1),
(2) Date: Apr. 23, 2019

(87) PCT Pub. No.: WO2018/078962
PCT Pub. Date: May 3, 2018

(65) Prior Publication Data
US 2019/0326111 A1    Oct. 24, 2019

(30) Foreign Application Priority Data

Oct. 27, 2016  (JP) .............................. JP2016-210939

(51) Int. Cl.
*H01L 21/02* (2006.01)
*C30B 25/02* (2006.01)
*C30B 29/40* (2006.01)

(52) U.S. Cl.
CPC .......... *H01L 21/0242* (2013.01); *C30B 25/02* (2013.01); *C30B 29/406* (2013.01); *H01L 21/02433* (2013.01)

(58) Field of Classification Search
CPC .......... H01L 21/0242; H01L 21/02433; H01L 21/02581; H01L 21/0262; H01L 21/0254; C30B 29/406; C30B 29/403
(Continued)

(56) References Cited

U.S. PATENT DOCUMENTS

| 2005/0009310 A1* | 1/2005 | Vaudo | H01L 21/02425 438/543 |
| 2005/0011432 A1* | 1/2005 | Kitaoka | C30B 19/04 117/54 |

(Continued)

FOREIGN PATENT DOCUMENTS

| JP | 2005-39248 A | 2/2005 |
| JP | 2007-153664 A | 6/2007 |

(Continued)

OTHER PUBLICATIONS

International Search Report for PCT/JP2017/025552 (dated Oct. 10, 2017).

(Continued)

*Primary Examiner* — Karen Kusumakar
*Assistant Examiner* — Adam S Bowen
(74) *Attorney, Agent, or Firm* — Pearne & Gordon LLP

(57) ABSTRACT

Provided is a semi-insulating crystal represented by a composition formula $In_xAl_yGa_{1-x-y}N$ (satisfying $0 \leq x \leq 1$, $0 \leq y \leq 1$, $0 \leq x+y \leq 1$), wherein each concentration of Si, B, and Fe in the crystal is less than $1 \times 10^{15}$ at/cm$^3$, electric resistivity under a temperature condition of 20° C. or more and 200° C. or less is $1 \times 10^6$ Ωcm or more.

7 Claims, 5 Drawing Sheets

(58) Field of Classification Search
USPC .......................................................... 257/103
See application file for complete search history.

(56) References Cited

U.S. PATENT DOCUMENTS

| | | | | |
|---|---|---|---|---|
| 2007/0128753 | A1* | 6/2007 | Oshima | H01L 21/02639 438/46 |
| 2007/0138505 | A1* | 6/2007 | Preble | H01L 21/02458 257/190 |
| 2010/0019277 | A1* | 1/2010 | Hata | H01L 29/7783 257/190 |
| 2010/0044718 | A1* | 2/2010 | Hanser | C30B 29/406 257/76 |
| 2011/0108944 | A1* | 5/2011 | Fujikura | H01L 21/02664 257/507 |
| 2012/0007102 | A1* | 1/2012 | Feezell | H01L 27/156 257/76 |
| 2012/0329245 | A1* | 12/2012 | Uematsu | H01L 21/02389 438/460 |
| 2014/0369920 | A1* | 12/2014 | Uematsu | C30B 29/403 423/409 |

FOREIGN PATENT DOCUMENTS

| | | |
|---|---|---|
| JP | 2007-534580 A | 11/2007 |
| JP | 2016-104693 A | 6/2016 |
| JP | 2016-164966 A | 9/2016 |

OTHER PUBLICATIONS

Written Opinion for PCT/JP2017/025552 (dated Oct. 10, 2017).
English Translation of the International Preliminary Report on Patentability and Written Opinion for PCT/JP2017/025552 (dated May 9, 2019).

* cited by examiner (a)

(b)

US 10,978,294 B2

SEMI-INSULATING CRYSTAL, N-TYPE SEMICONDUCTOR CRYSTAL AND P-TYPE SEMICONDUCTOR CRYSTAL

TECHNICAL FIELD

The present invention relates to a semi-insulating crystal, an n-type semiconductor crystal, and a p-type semiconductor crystal.

BACKGROUND ART

In the case of manufacturing a semiconductor device such as a light emitting element or a high-speed transistor, for example, a crystal of group-III nitride such as gallium nitride (GaN) may be sometimes used (see, Patent Document 1).

CITED DOCUMENT

Patent Document

Patent Document 1 JP 2007-153664 A

SUMMARY OF THE INVENTION

Problems to be Solved by the Invention

An object of the present invention is to provide a technology that can improve quality of the aforementioned crystal, and also improve performance and manufacturing yield of a semiconductor device manufactured using the crystal.

Means to Solve the Problem

According to an aspect of the present invention, there is provided a semi-insulating crystal represented by a composition formula $In_xAl_yGa_{1-x-y}N$ (satisfying $0 \leq x \leq 1$, $0 \leq y \leq 1$, $0 \leq x+y \leq 1$), wherein each concentration of Si, B, and Fe in the crystal is less than $1 \times 10^{15}$ at/cm$^3$, and an electric resistivity under a temperature condition of 20° C. or more and 200° C. or less is $1 \times 10^6$ Ωcm or more.

According to another aspect of the present invention, there is provided a semi-insulating crystal represented by a composition formula $In_xAl_yGa_{1-x-y}N$ (satisfying $0 \leq x \leq 1$, $0 \leq y \leq 1$, $0 \leq x+y \leq 1$), wherein each concentration of Si and B in the crystal is less than $1 \times 10^{15}$ at/cm$^3$, each concentration of O and C is less than $5 \times 10^{15}$ at/cm$^3$, concentration of Fe is $1 \times 10^{16}$ at/cm$^3$ or more, and an electric resistivity under a temperature condition of 20° C. or more and 200° C. or less is $1 \times 10^7$ Ωcm or more.

According to still another aspect of the present invention, there is provided an n-type semiconductor crystal represented by a composition formula $In_xAl_yGa_{1-x-y}N$ (satisfying $0 \leq x \leq 1$, $0 \leq y \leq 1$, $0 \leq x+y \leq 1$), wherein each concentration of B and Fe in the crystal is less than $1 \times 10^{15}$ at/cm$^3$, each concentration of O and C is less than $5 \times 10^{15}$ at/cm$^3$, concentration of Si is $1 \times 10^{15}$ at/cm$^3$ or more, and an electric resistivity under a temperature condition of 20° C. or more and 200° C. or less is $1 \times 10^2$ Ωcm or less.

According to still another aspect of the present invention, there is provided an n-type semiconductor crystal represented by a composition formula $In_xAl_yGa_{1-x-y}N$ (satisfying $0 \leq x \leq 1$, $0 \leq y \leq 1$, $0 \leq x+y \leq 1$), wherein each concentration of Si, B, and Fe in the crystal is less than $1 \times 10^{15}$ at/cm$^3$, each concentration of O and C is less than $5 \times 10^{15}$ at/cm$^3$, and an electric resistivity under a temperature condition of 20° C. or more and 200° C. or less is $1 \times 10^2$ Ωcm or less.

According to still another aspect of the present invention, there is provided a p-type semiconductor crystal represented by a composition formula $In_xAl_yGa_{1-x-y}N$ (satisfying $0 \leq x \leq 1$, $0 \leq y \leq 1$, $0 \leq x+y \leq 1$), wherein each concentration of Si, B, and Fe in the crystal is less than $1 \times 10^{15}$ at/cm$^3$, each concentration of O and C is less than $5 \times 10^{15}$ at/cm$^3$, concentration of Mg is $3 \times 10^{18}$ at/cm$^3$ or more, and an electric resistivity under a temperature condition of 20° C. or more and 200° C. or less is $1 \times 10^2$ Ωcm or less.

Advantageous Effect of the Invention

According to the present invention, quality of a group-III nitride crystal can be improved.

Best Mode of the Invention

First Embodiment of the Present Invention (1) Constitution of GaN-Substrate

Figure 1:
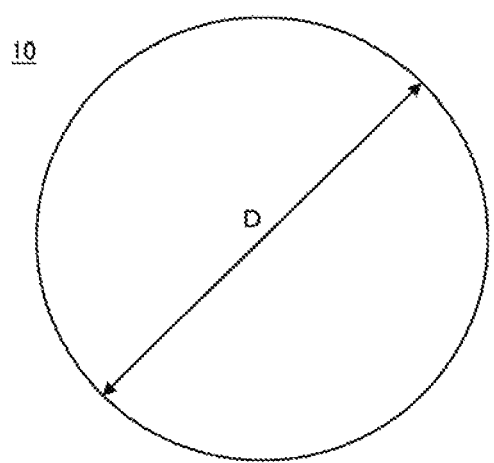
FIG. 1(a) is a plan view of a GaN-substrate.
FIG. 1(b) is a side view of the GaN-substrate.
Figure 1:
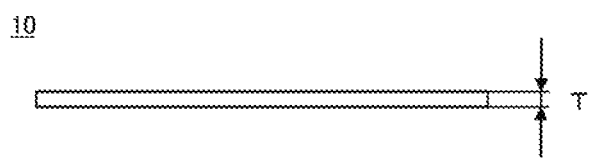

A crystal in this embodiment is constituted, as an example, as a planar (disc) substrate (wafer) 10 comprising a single crystal of GaN (hereinafter also referred to as GaN-crystal, or GaN-single crystal). FIG. 1(a) and FIG. 1(b) show a plan view and a side view of the substrate 10, respectively. The substrate 10 is suitably used for manufacturing a semiconductor device such as a laser diode, an LED, and a high speed transistor, and preferably has a diameter D of 25 mm or more since the substrate having a diameter D of less than 25 mm tends to result in reduced productivity of the semiconductor device. Preferably the substrate has a thickness T of 250 μm or more, since the substrate 10 having a thickness T of less than 250 μm has a low mechanical strength and is more susceptible to cracking of the substrate in a device structure during crystal growth or subsequent device processing, thus making it difficult to maintain a free-standing state. The dimensions described herein is just an example, and this embodiment is not limited thereto.

The substrate 10 is obtained by epitaxially growing a GaN-single crystal on a seed crystal substrate comprising a GaN-single crystal, using a hydride vapor phase epitaxy method (referred to as a HVPE method hereafter), and slicing and making this thick grown crystal ingot self-standing. Alternatively, the substrate 10 may also be obtained by using a GaN layer on the heterogeneous substrate as an underlayer as described in Patent Document 1, and making the GaN layer grow thicker through a nano-mask, peeling the resultant from the heterogeneous substrate, and removing a facet-grown crystal on the heterogeneous substrate side.

The substrate 10 in this embodiment is constituted as a semi-insulating substrate having a relatively higher insulation property, that is, having a relatively greater electric resistivity. As the electric resistivity of the GaN-crystal constituting the substrate 10, magnitude of $1\times10^6$ Ωcm or more is maintained, for example, under a temperature condition of 20° C. or more and 200° C. or less, and magnitude of $1\times10^5$ Ωcm or more is maintained under a temperature condition of more than 200° C. and 400° C. or less. For example, magnitude of about $1\times10^9$ Ωcm is shown as the upper limit of the electric resistivity of the GaN-crystal, although it is not particularly limited. Such a high electric resistivity of the GaN-crystal in this embodiment is attributable to extremely low concentrations of various impurities contained in the crystal, specifically, each concentration of silicon (Si), boron (B), and iron (Fe) being less than $1\times10^{15}$ at/cm$^3$, and each concentration of oxygen (O) and carbon (C) being less than $5\times10^{15}$ at/cm$^3$. All of the concentrations of these impurities are below a lower limit of measurement (lower limit of detection) of a currently available reasonable analytical means such as SIMS, and it is difficult to specifically present the concentration of each impurity at present.

It should be noted that in SIMS measurement that has been made on impurity elements other than the aforementioned impurities, none of the elements of arsenic (As), chlorine (Cl), phosphorus (P), fluorine (F), sodium (Na), potassium (K), tin (Sn), titanium (Ti), manganese (Mn), chromium (Cr), molybdenum (Mo), tungsten (W), and nickel (Ni) is detected, in other words, all of them are below a lower limit of detection. The lower limit of detection of each element in the SIMS measurement at present is as follows:

As: $5\times10^{12}$ at/cm$^3$, Cl: $1\times10^{14}$ at/cm$^3$, P: $2\times10^{15}$ at/cm$^3$, F: $4\times10^{13}$ at/cm$^3$, Na: $5\times10^{11}$ at/cm$^3$, K: $2\times10^{12}$ at/cm$^3$, Sn: $1\times10^{13}$ at/cm$^3$, Ti: $1\times10^{12}$ at/cm$^3$, Mn: $5\times10^{12}$ at/cm$^3$, Cr: $7\times10^{13}$ at/cm$^3$, Mo: $1\times10^{15}$ at/cm$^3$, W: $3\times10^{16}$ at/cm$^3$, Ni: $1\times10^{14}$ at/cm$^3$.

After intensive study by inventors of the present invention, it is found to be difficult to attain such an extremely low impurity concentration as described above by a conventional crystal growth method, for example, a method disclosed in JP 2007-153664 A. The above document discloses that combination of the following techniques enables great reduction of the concentration of impurities contained in the GaN-crystal:
(a) to bring a source gas or a carrier gas into contact with a Ga melt for a long period of time to let the Ga melt capture impurities contained in the gas in HVPE method;
(b) to pre-form a metal nano mask on a seed crystal substrate, the metal nano mask including a plurality of micropores having ability to capture impurities; and
(c) to shorten a growth period in the facet-plane state where impurities are easily incorporated to precociously shift to a growth on a plane where impurities are hardly incorporated. The above document describes that combination of these methods enables reduction of each concentration of As, O, Cl, P, Na, K, Sn, Ti, Fe, Cr, and Ni in the GaN-crystal to $1\times10^{17}$ at/cm$^3$ or less. However, according to intensive study by the inventors of the present invention, it is found that the extremely small concentration of the impurity such as the concentration in the GaN-crystal in this embodiment cannot be attained even if the aforementioned conventional method is used.

(2) GaN-Substrate Manufacturing Method

A manufacturing method of the substrate 10 in this embodiment will be specifically explained hereinafter.

First, a constitution of an HVPE apparatus 200 used for growing the GaN-crystal will be explained in detail, with reference to FIG. 2. The HVPE apparatus 200 includes a reaction vessel 203 formed into a cylindrical shape, for example. The reaction vessel 203 has a sealed structure so as not to allow entrance of atmospheric air outside thereof or a gas contained in a glove box 220 described later. In the reaction vessel 203, a reaction chamber 201 is formed in which the crystal growth is conducted. In the reaction chamber 201, a susceptor 208 is provided which retains a seed crystal substrate 20 comprising a GaN-single crystal. The susceptor 208 is connected to a rotary axis 215 of a rotary mechanism 216, and thus rotatably constituted. In addition, the susceptor 208 includes an internal heater 210. The internal heater 210 is constituted so that its temperature can be controlled separately from the temperature of a zone heater 207 described later. Moreover, the upstream side and the periphery of the susceptor 208 are covered with a heat shield wall 211. Since the heat shield wall 211 is provided, a gas other than the gas supplied from nozzles 249a to 249c described later will not be supplied to the seed crystal substrate 20.

Figure 3:
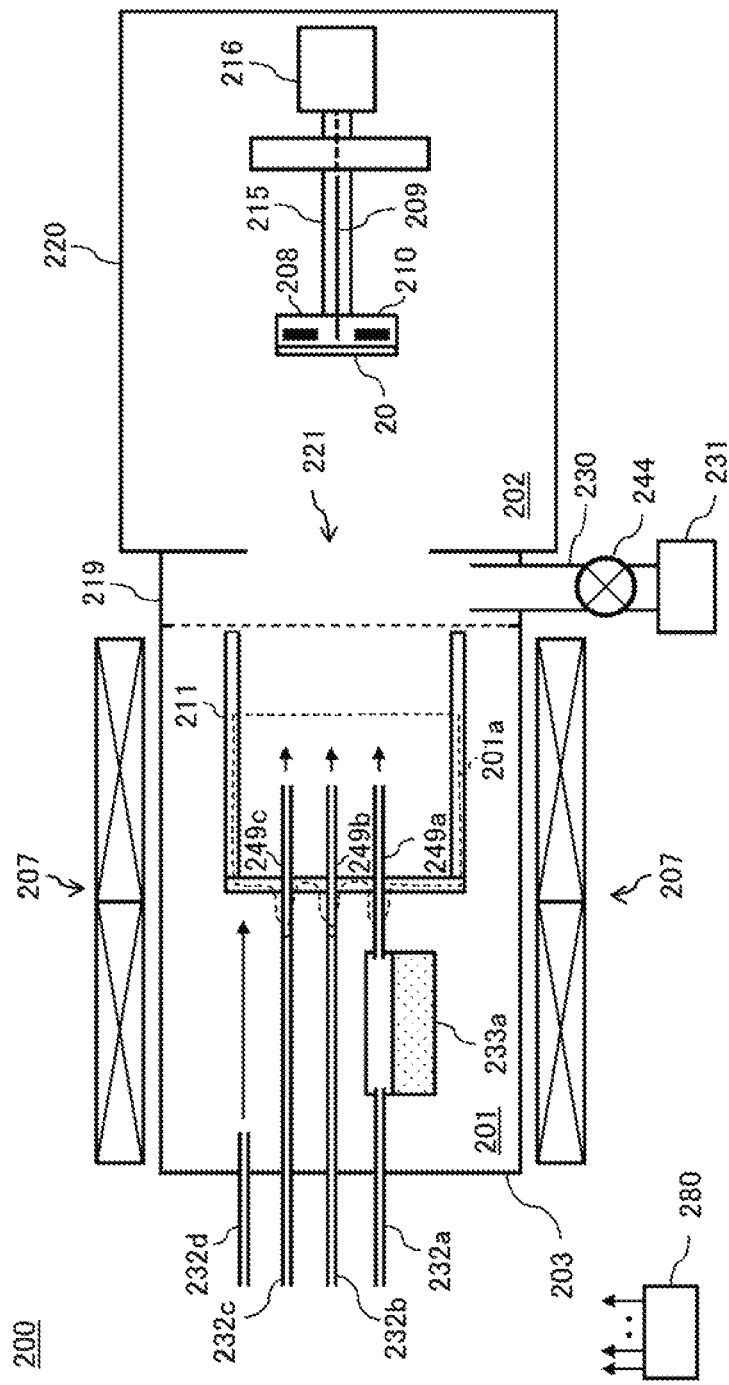
FIG. 3 is a schematic block diagram of the vapor phase growth apparatus, illustrating a reaction vessel whose furnace port being opened.

The reaction vessel 203 is connected to the glove box 220 through a cylindrical metal flange 219 comprising SUS or the like. The glove box 220 is also has an air-tight structure so as not to let the atmospheric air be incorporated therein. An exchanging chamber 202 provided in the glove box 220 is continuously purged with high-purity nitrogen (hereinafter also simply referred to as N$_2$ gas), and thus the concentrations of oxygen and water are maintained at low values. The glove box 220 includes a transparent acrylic wall, a plurality of rubber gloves connected to holes penetrating the wall, and a pass box to put an object in and out of the glove box 220. The pass box includes an evacuation mechanism and an N$_2$ purge mechanism, in which the atmospheric air is replaced with N$_2$ gas so that an object can be put in and out of the glove box 220 so as not to let the atmospheric air containing oxygen be incorporated therein. As shown in FIG. 3, the crystal substrate is put in and out of the reaction vessel 203, while the port of the metal flange 219, that is, the furnace port 221 is opened. In this way, re-contamination of the surface of each member in the reaction vessel 203, and adherence of the atmospheric air and the gas containing various impurities described above to the surface of the member may be prevented, the member been after completion of cleaning and modification through a high temperature baking step described later.

The reaction vessel 203 includes, at its one end, a gas supply pipe 232a for supplying hydrogen chloride (HCl) gas into a gas generator 233a described later, a gas supply pipe 232b for supplying ammonia (NH$_3$) gas into the reaction chamber 201, a gas supply pipe 232c for supplying HCl gas for high temperature baking and normal baking into the reaction chamber 201, and a gas supply pipe 232d for supplying nitrogen (N$_2$) gas into the reaction chamber 201, respectively. The gas supply pipes 232a to 232c are also constituted so as to be able to supply hydrogen (H$_2$) gas and N$_2$ gas as carrier gases in addition to HCl gas and NH$_3$ gas. The gas supply pipes 232a to 232c include a flow rate controller and a valve (both not shown) for each type of these gases, so as to conduct flow rate control and supply/stop of various gases individually for each type of gas. In addition, the gas supply pipe 232d also includes a flow rate controller and a valve (both not shown). N$_2$ gas supplied from the gas supply pipe 232d is used to purge the upstream side and the periphery of the heat shield wall 211 in the reaction chamber 201 to maintain cleanliness of the atmosphere of these portions.

HCl gas supplied from the gas supply pipe 232c, and H$_2$ gas supplied from the gas supply pipes 232a to 232c serve as cleaning gases for cleaning the surface of the member in the reaction chamber 201 (particularly, the inside of the heat shield wall 211) in a high temperature baking step and an normal baking step described later, and also serve as modification gases for modifying the surface to a surface with less possibility to release impurities. N$_2$ gas supplied from the gas supply pipes 232a to 232c serve to appropriately regulate a blowout flow velocity of HCl gas and H$_2$ gas being ejected from the tip of the nozzles 249a to 249c so that a desired portion of the reaction chamber 201 (particularly, the inside of the heat shield wall 211) is appropriately cleaned in each baking step.

HCl gas introduced from the gas supply pipe 232a serves as a reactant gas that reacts with a Ga-source to produce GaCl gas which is a halide of Ga, that is, a Ga source gas, in a crystal growth step described later. Further, NH$_3$ gas supplied from the gas supply pipe 232b serves as a nitriding agent which reacts with GaCl gas to grow GaN, a nitride of Ga, on the seed crystal substrate 20, that is, as N source gas, in the crystal growth step described later. Hereinafter, GaCl gas and NH$_3$ gas may be collectively referred to as a source gas. H$_2$ gas and N$_2$ gas supplied from the gas supply pipes 232a to 232c serve to appropriately regulate the blowout flow velocity of the source gas which is ejected from the tips of the nozzles 249a to 249c to direct the source gas toward the seed crystal substrate 20, in the crystal growth step described below.

On the downstream side of the gas supply pipe 232a, as described above, the gas generator 233a which contains the Ga melt as a Ga-source is provided. The gas generator 233a is provided with a nozzle 249a which supplies GaCl gas produced by the reaction between HCl gas and the Ga melt to a principal surface of the seed crystal substrate 20 retained on the susceptor 208. On the downstream side of the gas supply pipes 232b, 232c, nozzles 249b, 249c are provided, which supply various gases supplied from these gas supply pipes toward the principal surface of the seed crystal substrate 20 retained on the susceptor 208. Each of the nozzles 249a to 249c is constituted so as to penetrate the upstream side of the heat shield wall 211.

The gas supply pipe 232c is constituted to be able to supply, in addition to HCl gas, H$_2$ gas, and N$_2$ gas, Fe-containing gas such as ferrocene (Fe(C$_5$H$_5$)$_2$, abbreviated as Cp$_2$Fe) gas or iron (III) trichloride (FeCl$_3$) gas, Si-containing gas such as silane (SiH$_4$) gas or dichlorosilane (SiH$_2$Cl$_2$) gas, or Mg-containing gas such as bis(cyclopentadienyl) magnesium (Mg(C$_5$H$_5$)$_2$, abbreviated as Cp$_2$Mg) gas, as a dopant gas.

The metal flange 219 provided on the other end of the reaction vessel 203 is provided with an exhaust pipe 230 for exhausting the reaction chamber 201. The exhaust pipe 230 includes an APC valve 244 as a pressure regulator and a pump 231, in this order from upstream side. Instead of the APC valve 244 and the pump 231, a blower including a pressure regulation mechanism may be used.

The outer circumference of the reaction vessel 203 is provided with a zone heater 207 which heats the inside of the reaction chamber 201 to a desired temperature. The zone heater 207 includes at least two heaters, i.e., one for an upstream side portion surrounding the gas generator 233a and one for a downstream side portion surrounding the susceptor 208, each heater having a temperature sensor and a temperature regulator (both not shown) so as to enable individual regulation of temperature within a range from a room temperature to 1200° C.

In addition, as described above, the susceptor 208 retaining the seed crystal substrate 20 includes, the internal heater 210, a temperature sensor 209, and a temperature regulator (not shown) separately from the zone heater 207, so as to enable temperature regulation at least in a range from room temperature to 1600° C. In addition, the upstream side and the periphery of the susceptor 208 are, as described above, enclosed by the heat shield wall 211. Regarding the heat shield wall 211, it is necessary to use a limited member for at least a surface (inner circumference surface) facing the susceptor 208 so as not to generate impurities, as described later. However, there is no limitation to the member to be used for the surface other than the inner circumference surface (outer circumference surface) so long as it is resistant to a temperature of 1600° C. or more. In the heat insulation wall 211, at least a portion excluding the inner circumference surface may include, for example, a highly thermal resistant, non-metallic material such as carbon or silicon carbide (SiC), or a highly thermal resistant, metallic material such as Mo or W, and may be designed as a constitution including laminated plate-like reflectors. Using this constitution, the temperature of the outside of the heat shield wall 211 may be suppressed to 1200° C. or less even when the temperature of the susceptor 208 is 1600° C. Quartz may be used for each member constituting the upstream side portion such as the reaction vessel 203, the gas generator 233a, and the gas supply pipes 232a to 232d in this constitution, since this temperature is equal to or less than a softening point of quartz.

In the reaction chamber 201, surfaces of members which form an area heated to 900° C. or more during the crystal growth step described later, which is an area (high-temperature reaction area) 201a possibly contacted with the gas supplied to the seed crystal substrate 20, contains a material having heat resistance to at least 1600° C. or more and not containing quartz (SiO$_2$) and B. Specifically, surfaces of an inside wall of a portion of the heat shield wall 211 located on the upstream side of the susceptor 208, internally penetrating portions of the nozzles 249a to 249c penetrating through the heat shield wall 211, a heating portion outside of the heat shield wall 211a, which is to be heated to 900° C. or more in the crystal growth step, the susceptor 208, and the like may contain a heat resistant material such as alumina (Al$_2$O$_3$), SiC, graphite, or pyrolytic graphite. It goes without saying that the portion surrounding the internal heater 210, which is not included in the area 201a, is also required to have heat resistance to at least 1600° C. or more. The reason why the members forming the area 201a or the like are required to have such a high heat resistance is that the high temperature baking step is conducted before conducting the crystal growth step as described later.

Members included in the HVPE apparatus, such as various valves and a flow rate controller included in the gas supply pipes 232a to 232d, the pump 231, the APC valve 244, the zone heater 207, the internal heater 210, and the temperature sensor 209 are respectively connected to a controller 280 constituted as a computer.

Next, an example of the treatment for epitaxially growing the GaN-single crystal on the seed crystal substrate 20 using the aforementioned HVPE apparatus 200 will be explained in detail with reference to FIG. 2. In the following explanation, the operation of each part constituting the HVPE apparatus 200 is controlled by the controller 280.

(High Temperature Baking Step)

This step is conducted when the inside of the reaction chamber 201 and the inside of the exchanging chamber 202 are exposed to the atmospheric air, when conducting maintenance of the HVPE apparatus 200 or loading of the Ga-source into the gas generator 233a. Before conducting this step, it should be confirmed that air tightness of the reaction chamber 201 and the exchanging chamber 202 is secured. After the air tightness is confirmed, the inside of the reaction chamber 201 and the inside of the exchanging chamber 202 are respectively replaced with $N_2$ gas so that the insides of these chambers are in low oxygen and water content states. Thereafter, the surfaces of various members are subjected to heat treatment while the inside of the reaction vessel 203 is in a predetermined atmosphere. The treatment is conducted while the seed crystal substrate 20 is not loaded into the reaction vessel 203, and Ga-source is loaded into the gas generator 233a.

In this step, the temperature of the zone heater 207 is regulated to the similar temperature to the temperature in the crystal growth step. Specifically, the temperature of an upstream-side heater surrounding the gas generator 233a is set to a temperature from 700 to 900° C. while a downstream-side heater surrounding the susceptor 208 is set to a temperature from 1000 to 1200° C. Further, the temperature of the internal heater 210 is set to a predetermined temperature of 1500° C. or more. As described later, in the crystal growth process, since the internal heater 210 is off or set to the temperature of 1200° C. or less, the temperature of the high temperature reaction area 201a becomes 900° C. or more and less than 1200° C. On the other hand, in the high temperature baking step, since the temperature of the internal heater 210 is set to the temperature of 1500° C. or more, the temperature of the high temperature reaction area 201a becomes 1000 to 1500° C. or more, the temperature in the neighborhood of the susceptor 208 on which the seed crystal substrate 20 is mounted becomes as high as 1500° C. or more, and, as for other location, the temperature at each location becomes 100° C. or more higher than the temperature during the crystal growth step. The portion in the high temperature reaction area 201a, where the temperature is 900° C. which is lowest during conducting the crystal growth step, specifically the portion upstream of the nozzles 249a to 249c inside of the heat shield wall 211, is the portion where an adhered impurity gas is most difficult to remove. Since the temperature of the internal heater 210 is set to 1500° C. or more so that the temperature at this site becomes at least 1000° C. or more, the effect of cleaning and modification treatment described later, that is, the effect of reducing impurities in the GaN-crystal can be sufficiently attained. When the temperature of the internal heater 210 is set to a temperature of less than 1500° C., the temperature at any point in the high temperature reaction area 201a cannot be sufficiently raised, and thus the effect of cleaning and modification treatment described later, that is, the effect of reducing impurities in the GaN-crystal can be hardly attained.

The upper limit of the temperature of the internal heater 210 in this step depends on the ability of the heat shield wall 211. Namely, so long as the temperature of the quartz parts and the like on the outside of the heat shield wall 211 is suppressed within a range not exceeding their heat resistant temperature, the higher the temperature of the internal heater 210, the more easily the effect of cleaning and modification treatment described later can be obtained. When the temperature of the quartz parts on the outside of the heat shield wall 211 exceeds their heat resistant temperature, maintenance frequency and the cost of the HVPE apparatus 200 are increased in some cases.

Further, in this step, after the temperatures of the zone heater 207 and the internal heater 210 have reached respectively at the aforementioned predetermined temperatures, $H_2$ gas is supplied from each of the gas supply pipes 232a, 232b, for example, at a flow rate of about 3 slm. In addition, HCl gas is supplied from the gas supply pipe 232c, for example, at a flow rate of about 2 slm, and at the same time, $H_2$ gas is supplied, for example, at a flow rate of about 1 slm. In addition, $N_2$ gas is supplied from the gas supply pipe 232d, for example, at a flow rate of about 10 slm. Then, this state is maintained for a predetermined period to conduct baking in the reaction chamber 201. Since the supply of $H_2$ gas and HCl gas is started at the aforementioned timing, that is, after raising a temperature in the reaction chamber 201, an amount of gas which flows out wastefully without contributing to the cleaning and modification treatment described later can be reduced, and a cost for the treatment of the crystal growth can be reduced.

Further, since this step is conducted while operating the pump 231, and at this time, an opening degree of the APC valve 244 is regulated, the pressure in the reaction vessel 203 is maintained, for example, at a pressure of 0.5 atm or more and 2 atm or less. Also, since this step is conducted while exhausting the reaction vessel 203, removal of the impurities from the reaction vessel 203, that is, cleaning of inside of the reaction vessel 203 can be efficiently conducted. When the pressure in the reaction vessel 203 is less than 0.5 atm, it becomes difficult to attain the effect of cleaning and modification treatment described later. In addition, when the pressure in the reaction vessel 203 exceeds 2 atm, the members in the reaction chamber 201 will receive excessive etching damage.

Further, in this step, a partial pressure ratio of HCl gas to $H_2$ gas (HCl partial pressure/$H_2$ partial pressure) in the reaction vessel 203 is, for example, set to 1/50 to 1/2. When the aforementioned partial pressure ratio is smaller than 1/50, it becomes difficult to attain the effect of cleaning and modification treatment described later. In addition, when the partial pressure ratio exceeds 1/2, the members in the reaction chamber 201 will receive excessive etching damage. The partial pressure can be controlled by regulating the flow rate of the flow rate controller provided to the gas supply pipes 232a to 232c.

Since this step is conducted for a period of 30 minutes or more and 300 minutes or less, the surfaces of the various members constituting at least the high temperature reaction area 201a in the reaction chamber 201 can be cleaned, and the impurities adhering to the surfaces can be removed. Then, since the surfaces of these members are maintained at the temperature 100° C. or more higher than the temperature in the crystal growth step described later, release of the impurity gas from these surfaces can be promoted, and these surfaces can be modified to the surfaces where the release of impurities such as Si, B, Fe, O, and C hardly occurs under the temperature and pressure conditions in the crystal growth step. When the time for conducting this step becomes less than 30 minutes, the effect of cleaning and modification treatment described herein becomes insufficient in some cases. In addition, when the time for conducting this step exceeds 300 minutes, the members which form the reaction chamber 201a will receive excessive damage.

When the $H_2$ and HCl gas are supplied into a reaction vessel 203, the supply of $NH_3$ gas into the reaction vessel 203 is not conducted. In this step, when $NH_3$ gas is supplied into the reaction vessel 203, it becomes more difficult to obtain the effect of the aforementioned cleaning and modification treatment, particularly the effect of the modification treatment.

Further, when $H_2$ gas and HCl gas are supplied into the reaction vessel 203, halogen-based gas such as chlorine ($Cl_2$) gas may be supplied in place of HCl gas. In this case, the effect of the aforementioned cleaning and modification treatment can be obtained as well.

In addition, when $H_2$ gas and HCl gas are supplied into the reaction vessel 203, $N_2$ gas may be added as a carrier gas from the gas supply pipes 232a to 232c. Since the blowout flow velocity of the gas from the nozzles 249a to 249c can be regulated by adding $N_2$ gas, generation of a portion where the aforementioned cleaning and modification treatment is incomplete can be prevented. Rare gas such as Ar gas or He gas may be supplied in place of $N_2$ gas.

Upon completion of the aforementioned cleaning and modification treatment, output of the zone heater 207 is reduced, the temperature in the reaction vessel 203 is decreased, for example, to 200° C. or less, that is, the temperature is decreased to a temperature at which the seed crystal substrate 20 can be loaded into the reaction vessel 203. Further, the supply of $H_2$ gas and HCl gas into the reaction vessel 203 is stopped and the inside of the reaction vessel is purged with $N_2$ gas. Upon completion of the purge in the reaction vessel 203, the opening degree of the APC valve 244 is regulated so that the pressure in the reaction vessel 203 becomes atmospheric pressure or slightly higher than atmospheric pressure, while maintaining the supply of $N_2$ gas into the reaction vessel 203.

(Normal Baking Step)

The aforementioned high temperature baking step is conducted when the inside of the reaction chamber 201 and the inside of the exchanging chamber 202 are exposed to the atmospheric air. However, when the crystal growth step is conducted, ordinarily, the inside of the reaction chamber 201 and the inside of the exchanging chamber 202 are not exposed to atmospheric air before, during, and after the crystal growth step. Accordingly, the high temperature baking step is not required. In this case, since the crystal growth step is conducted, polycrystalline GaN will adhere to the surfaces of the nozzles 249a to 249c, the surface of the susceptor 208, and the inside wall of the heat shield wall 211. When the subsequent crystal growth step is conducted with the polycrystalline GaN remaining, polycrystalline GaN powder, Ga droplets or the like, scattered upon separation from the polycrystal will adhere to the seed crystal substrate 20. As a result, good crystal growth is inhibited. Therefore, the normal baking step is conducted after the crystal growth step in order to remove the aforementioned polycrystalline GaN. The procedures and conditions of the normal baking step are the same as those in the high temperature baking step, except that the internal heater 210 is in the off state and the temperature in the neighborhood of the susceptor 208 is set to the temperature from 1000 to 1200° C. Since the normal baking step is conducted, the polycrystalline GaN can be removed from the reaction chamber 201.

(Crystal Growth Step)

After the high temperature baking step or the normal baking step is conducted, and upon completion of decrease of the temperature and the purge of inside of the reaction vessel 203, as shown in FIG. 3, the furnace port 221 of the reaction vessel 203 is opened, and the seed crystal substrate 20 is mounted on the susceptor 208. The furnace port 221 is isolated from the atmospheric air, and connected to the glove box 220 which is continuously purged with $N_2$ gas. The glove box 220 includes, as described above, a transparent acrylic wall, a plurality of rubber gloves connected to holes penetrating the wall, and a pass box to put an object in and out of the glove box 220. Since the atmospheric air in the pass box is replaced with $N_2$ gas, the object can be put in and out of the glove box 220 so as not to let the atmospheric air containing oxygen to be incorporated therein. Since the mounting operation of the seed crystal substrate 20 is conducted using such a mechanism, re-contamination of each member in the reaction vessel 203 after completion of the cleaning and modification treatment through the high temperature baking step and re-adhesion of the impurity gas to these members can be prevented. The surface of the seed crystal substrate 20 to be mounted on the susceptor 208, that is, the principal surface (crystal growth surface, base surface) on the side facing the nozzles 249a to 249c is to be, for example, (0001) plane, that is, +c-plane (Ga polar plane) of the GaN-crystal.

Upon completion of loading the seed crystal substrate 20 into the reaction chamber 201, the furnace port 221 is closed, and the supply of $H_2$ gas, or $H_2$ gas and $N_2$ gas is started while heating and exhausting the reaction chamber 201. Thereafter, when the temperature and the pressure inside of the reaction chamber 201 reach a desired treatment temperature and a desired treatment pressure to attain a desired atmosphere in the reaction chamber 201, the supply of HCl gas and $NH_3$ gas from the gas supply pipes 232a, 232b is started, and the GaCl gas and $NH_3$ gas are respectively supplied to the surface of the seed crystal substrate 20. Accordingly, as shown in a cross-sectional view in FIG. 4(a), the GaN-crystal is epitaxially grown on the surface of the seed crystal substrate 20 to form a GaN-crystal film 21.

In this step, the supply of $NH_3$ gas into the reaction chamber 201 is preferably started before or at the time when the temperature of the seed crystal substrate 20 reaches 500° C., in order to prevent thermal decomposition of the GaN-crystal which constitutes the seed crystal substrate 20. Further, in order to improve in-plane film thickness uniformity or the like of the GaN-crystal film 21, this step is preferably conducted while the susceptor 208 being rotating.

In this step, the temperature of the zone heater 207 is set to, for example, from 700 to 900° C. for the upstream-side heater surrounding the gas generator 233a, whereas the temperature is set to, for example, from 1000 to 1200° C. for the downstream-side heater surrounding the susceptor 208. Accordingly, the temperature of the susceptor 208 is regulated to a predetermined crystal growth temperature from 1000 to 1200° C. In this step, the internal heater 210 may be used in the off state but temperature control may be conducted using the internal heater 210 so long as the temperature of the susceptor 208 is in the aforementioned range from 1000 to 1200° C.

Examples of other treatment conditions of this step include the followings:

Treatment pressure: 0.5 to 2 atm;
Partial pressure of GaCl gas: 0.1 to 20 kPa;
Partial pressure of $NH_3$ gas/partial pressure of GaCl gas: 1 to 100; and
Partial pressure of $H_2$ gas/partial pressure of GaCl gas: 0 to 100.

Further, when GaCl gas and $NH_3$ gas are supplied to the surface of the seed crystal substrate 20, $N_2$ gas may be added as a carrier gas from each of the gas supply pipes 232a to 232c. Since $N_2$ gas is added to regulate the blowout flow velocity of the gas supplied from the nozzles 249a to 249c, distribution of a supply amount or the like of the source gas on the surface of the seed crystal substrate 20 can be appropriately controlled, and a uniform growth rate distribution across the surface can be attained. Rare gas such as Ar gas or He gas may be supplied in place of $N_2$ gas.

(Unloading Step)

When the GaN-crystal film 21 is grown to a desired thickness on the seed crystal substrate 20, the supply of HCl gas and $H_2$ gas into the reaction chamber 201 and heating by the zone heater 207 are respectively stopped while supplying $NH_3$ gas and $N_2$ gas into the reaction chamber 201 and exhausting the reaction chamber 201. When the temperature in the reaction chamber 201 is decreased to 500° C. or less, the supply of $NH_3$ gas is stopped, and atmosphere in the reaction chamber 201 is replaced with $N_2$ gas and is restored to the atmospheric pressure. Then, the temperature in the reaction chamber 201 is decreased, for example, to a temperature of 200° C. or less, that is, a temperature at which the crystal ingot of the GaN (the seed crystal substrate 20 with the GaN-crystal film 21 formed on the surface) can be unloaded from the reaction vessel 203. Thereafter, the crystal ingot is unloaded from the reaction chamber 201 through the glove box 220 and the pass box.

(Slicing Step)

Figure 4:
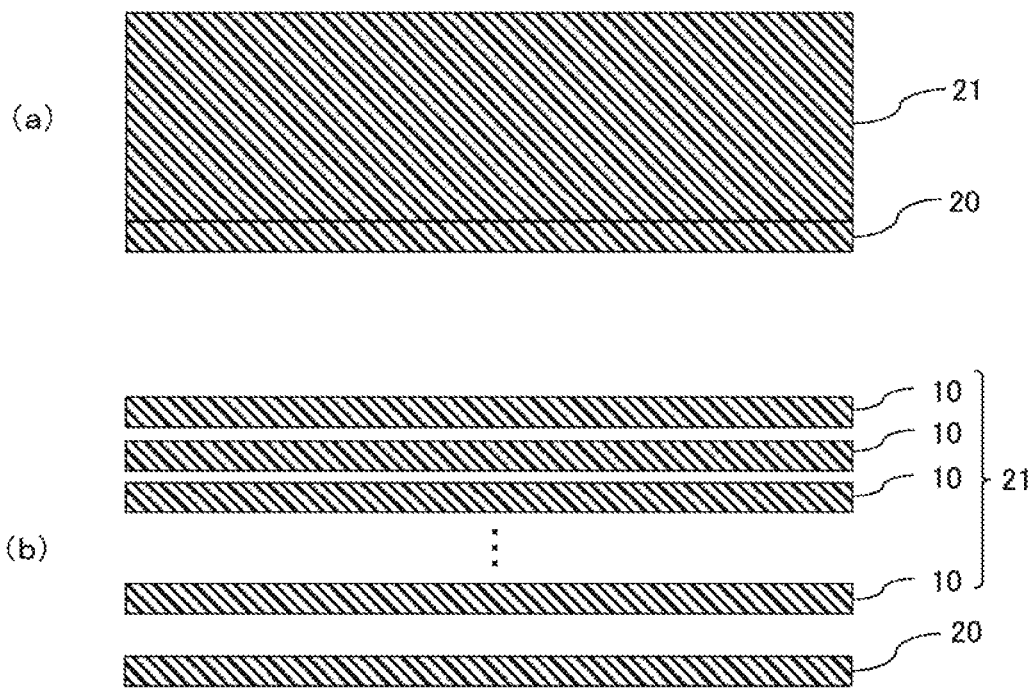
FIG. 4(a) is a diagram illustrating a state of a GaN-crystal film having been grown thicker on a seed crystal substrate.
FIG. 4(b) is a diagram illustrating a state of obtaining plural GaN-substrates by slicing the GaN-crystal film which has been grown thicker.

Since the unloaded crystal ingot is subsequently sliced, for example, in parallel to a growth plane, one or more substrates 10 can be obtained as shown in FIG. 4 (*b*). This slicing process can be conducted using, for example, a wire saw or an electric discharge machine. Since the front surface (+c-plane) of the substrate 10 is subsequently subjected to a predetermined abrasive machining, this plane may be processed into an epi-ready, mirror-surface. The rear surface (−c-plane) of the substrate 10 is processed into a lap-surface or a mirror-surface.

The aforementioned high temperature baking step, the normal baking step, the crystal growth step and the unloading step are preferably conducted in the order described below. Namely, for example, the following steps are conducted in the order stated: exposing the inside of the reaction chamber 201 and the exchanging chamber 202 to atmospheric air→high temperature baking step→crystal growth step→unloading step→(normal baking step→crystal growth step→unloading step)×n, wherein n is an integer of 1 or more.

(3) Effect Obtained by this Embodiment

According to this embodiment, one or more effects shown below may be obtained.

(a) Each concentration of Si, B and Fe in the GaN-crystal obtained in this embodiment is as extremely small as less than $1\times10^{15}$ at/$cm^3$, and each concentration of O and C is as extremely small as less than $5\times10^{15}$ at/$cm^3$. The concentrations of these impurities are not actually measured concentrations of the respective impurities but indicate the current lower limit of detection in SIMS measurement which is a representative technique of analyzing impurities. In other words, it means that the actual concentrations of the respective impurities can be reduced to an undetectably low value according to the current technique.

The GaN-crystal obtained according to this embodiment has extremely excellent crystal quality, that is, greatly reduced defect density, dislocation density, internal stress, compared to the conventional GaN-crystal, for example, the GaN-crystal obtained by the method disclosed in JP 2007-153664 A, which contains these impurities in more amount. Further, the GaN-crystal according to this embodiment is sliced to obtain a substrate 10, and when the resulting substrate is used to fabricate a semiconductor device, diffusion of the impurities may be suppressed compared to a case of using a substrate comprising the aforementioned GaN-crystal which contains more impurities, and, as a result, improved property and prolonged service life of the device can be obtained.

(b) Since the GaN-crystal obtained according to this embodiment is of high purity as described above, it possesses high insulation property, i.e., electric resistivity under a temperature condition of 20° C. or more and 200° C. or less of $1\times10^6$ Ωcm or more. Namely, when the GaN-crystal contains a large amount of donor impurities such as Si or O, there is known a method, as disclosed in JP 2007-534580, of adding to the crystal donor-compensating impurities (hereinafter referred to as compensating impurities) such as Mn, Fe, cobalt (Co), Ni, copper (Cu) in order to improve the insulation property of the crystal. However, this method is disadvantageously accompanied by a problem in that, upon addition of the compensating impurities, the quality of the GaN-crystal is more likely to be degraded. For example, when the compensating impurities are added into the GaN-crystal, a crack is likely to be generated in a substrate obtained by slicing the crystal. Further, when the compensating impurities are diffused over the laminated structure formed on the substrate, the quality of the semiconductor device fabricated using this substrate is more likely to be degraded. In contrast, the GaN-crystal according to this embodiment enables to obtain high insulation property without adding the compensating impurities, and as a result, a problem of degraded crystallinity which is likely to be problematic in a conventional method can be avoided.

(c) The insulation property of the GaN-crystal obtained according to this embodiment is less temperature dependent and more stable compared to the insulation property obtained by adding an impurity for compensating into the crystal. Indeed, it seems that an insulation property similar to that of the GaN-crystal according to this embodiment can be imparted upon addition of Fe to a GaN-crystal containing Si or O at the concentration of, for example, $1\times10^{17}$ at/$cm^3$ or more, the concentration of Fe exceeding the concentration of Si or O. However, the level of Fe which is used as a compensating impurity is as relatively low as about 0.6 eV. Therefore, the insulation property obtained upon addition of Fe may be characteristically more easily deteriorated with increasing temperature, compared to the insulation property of the GaN-crystal according to this embodiment. On the contrary, according to this embodiment, the insulation property can be attained without adding the compensating impurity. Accordingly, the problem of increased temperature dependency may be avoided which is frequently problematic in the conventional method.

(d) The GaN-crystal obtained according to this embodiment has high purity as described above. Accordingly, when the crystal is made into an n-type semiconductor by Si ion implantation or when the crystal is made into a p-type semiconductor by Mg ion implantation, an amount of implanted ion can be reduced. In other words, the GaN-crystal according to this embodiment is more advantageous compared to the conventional GaN-crystal which contains more impurities such as Fe, in that it can impart a desired semiconductor property while suppressing degradation of the crystal resulting from ion implantation as much as possible. In addition, the GaN-crystal according to this embodiment is more advantageous compared to the conventional GaN-crystal containing more impurities also in that it has extremely low concentration of impurities which may cause a carrier scattering and thus can avoid reduced mobility of the carrier.

(e) When members forming at least the aforementioned high temperature reaction area 201a in the reaction chamber 201 contain a non-O-containing heat resistant material, such as SiC or graphite, the concentration of O in the GaN-crystal to be grown on the seed crystal substrate 20 can be further reduced. Accordingly, the quality of the GaN-crystal can be further improved, and hence the insulation property can be further improved.

(f) In the reaction chamber 201, when members forming at least the aforementioned high temperature reaction area 201a include a non-C-containing heat resistant material such as alumina, the concentration of C in the GaN-crystal to be grown on the seed crystal substrate 20 can be further reduced. In this way, the quality of the GaN-crystal can be further improved.

Second Embodiment of the Present Invention

Next, the second embodiment of the present invention will be explained mainly on the difference with the first embodiment.

The GaN-crystal in this embodiment is similar to the GaN-crystal in the first embodiment in that each concentration of Si and B is less than $1\times10^{15}$ at/cm$^3$ and each concentration of O and C is less than $5\times10^{15}$ at/cm$^3$, but different from the GaN-crystal in the first embodiment in that the concentration of Fe is relatively large, i.e., $1\times10^{16}$ at/cm$^3$ or more. Since the GaN-crystal in this embodiment contains Fe at such a concentration, it has a greater insulation property compared to that of the GaN-crystal in the first embodiment, i.e., an electric resistivity under a temperature condition of 20° C. or more and 200° C. or less is $1\times10^{7}$ Ωcm or more. The concentration of Fe may be set to, for example, $1\times10^{16}$ at/cm$^3$ or more and $1\times10^{19}$ at/cm$^3$ or less. In this case, the electric resistivity under a temperature condition of 20° C. or more and 200° C. or less is, for example, $1\times10^{7}$ Ωcm or more and $5\times10^{10}$ Ωcm or less.

Fe-containing gas such as Cp$_2$Fe gas may be supplied along with the source gas (GaCl gas+NH$_3$ gas) from the gas supply pipe 232c to the seed crystal substrate 20 to add Fe into the GaN-crystal, in the aforementioned crystal growth step. The partial pressure ratio of Fe-containing gas to group III source gas (partial pressure of Fe-containing gas/partial pressure of total GaCl gas) in the reaction vessel 203 may be, for example, $1/1\times10^{6}$ to $1/100$. Use of a dopant gas is advantageous in that Fe can be added uniformly across the total area in the direction of thickness of the GaN-crystal, and further, in that it becomes easier to avoid damage posed on the surface of the crystal compared to an ion implantation described later.

FeCl$_3$ gas may be used in place of Cp$_2$Fe gas. For example, a metallic iron may be placed in a high temperature area at around 800° C. located in the middle of the gas supply pipe 232c and HCl gas may be passed therethrough to generate the FeCl$_3$ gas. It is advantageous to use FeCl$_3$ gas in place of Cp$_2$Fe gas in that incorporation of the C component included in Cp$_2$Fe gas into the crystal, that is, increase in the C concentration in the GaN-crystal may be more easily avoided.

Alternatively, the substrate 10 may be obtained in the same manner as in the first embodiment, then Fe ion may be implanted to the resulting substrate 10 to add Fe into the GaN crystal. It is advantageous to use ion implantation in that incorporation of the C component included in Cp$_2$Fe gas into the crystal, that is, increase in the C concentration in the GaN-crystal may be more easily avoided.

Compared to the conventional GaN-crystal containing more impurities, the GaN-crystal obtained according to this embodiment has a better quality since each concentration of Si, B, O and C in the crystal is extremely small like the GaN-crystal according to the first embodiment. According to this embodiment, since the concentration of Fe in the GaN-crystal may be increased as described above, its insulation property can be enhanced compared to that of the GaN-crystal according to the first embodiment.

Third Embodiment of the Present Invention

Next, the third embodiment of the present invention will be explained mainly on the difference from the first embodiment.

The GaN-crystal in this embodiment is similar to the GaN-crystal of the first embodiment in that each concentration of B and Fe in the crystal is less than $1\times10^{15}$ at/cm$^3$, each concentration of O and C is less than $5\times10^{15}$ at/cm$^3$, but different from the GaN-crystal of the first embodiment in that the concentration of Si is $1\times10^{15}$ at/cm$^3$ or more. Since the GaN-crystal in this embodiment contains Si at such a concentration, it has conductive property, that is, an electric resistivity under a temperature condition of 20° C. or more and 200° C. or less of $1\times10^{2}$ Ωcm or less, and functions as a so-called n-type semiconductor crystal. For example, the Si concentration may be $1\times10^{15}$ at/cm$^3$ or more and $5\times10^{19}$ at/cm$^3$ or less. In this case, the n-type carrier concentration under a temperature condition of 20° C. or more and 200° C. or less is, for example, $1\times10^{15}$/cm$^3$ or more and $5\times10^{19}$/cm$^3$ or less, and the electric resistivity under the same temperature conditions is, for example, $1\times10^{-4}$ Ωcm or more and 100 Ωcm or less.

In the GaN-crystal according to this embodiment, the Si concentration and the n-type carrier concentration are almost the same value in the crystal. This indicates that the actual concentration of the impurity, from which a carrier is derived, other than Si (Fe or C which compensates an n-type carrier, O which serves as a donor, or the like) is extremely small, and the GaN-crystal contains such an impurity in only a negligible amount compared to the minimum value of the Si concentration in this embodiment, i.e. $1\times10^{15}$ at/cm$^3$. Although according to the SIMS measurement, the concentrations of B, Fe, C and O are shown in the order of $10^{15}$ at/cm$^3$ or less, and the concentrations of other impurities are shown as the concentration less than a lower limit of detection, the concentrations of Si and the n-type carrier in the crystal are indicated as almost the same values, which means that the actual concentration of these impurities is in the order of $10^{14}$ at/cm$^3$ or less.

Si-containing gas such as SiH$_4$ gas or SiH$_2$Cl$_2$ may be supplied along with the source gas (GaCl gas+NH$_3$ gas) to the seed crystal substrate 20 to add Si into the GaN-crystal, in the aforementioned crystal growth step. The partial pressure ratio of Si-containing gas to group III source gas in the reaction vessel 203 (partial pressure of Si-containing gas/partial pressure of total GaCl gas) may be, for example, $1/1\times10^{8}$ to $1/1000$. Further, the substrate 10 may be obtained in the same manner as in the first embodiment, and then Si ion may be implanted to the resulting substrate 10 to add Si into the GaN-crystal.

Compared to the conventional GaN-crystal containing more impurities, the GaN-crystal obtained according to this embodiment has a better quality since each concentration of B, Fe, O and C in the crystal is extremely small like the GaN-crystal according to the first embodiment. According to this embodiment, since the concentration of impurities such as Fe in the GaN-crystal is small as described above, a desired conductive property (n-type semiconductor property) may be imparted to the GaN-crystal even when an amount of the Si to be added is suppressed. The GaN-crystal according to this embodiment is more advantageous in that a desired semiconductor property may be imparted while suppressing degradation of crystal resulting from Si addition as much as possible compared to the conventional GaN-crystal containing more impurities such as Fe or C. Further, the GaN-crystal according to this embodiment is more advantageous compared to the conventional GaN-crystal containing more impurities in that it has extremely low concentration of impurities which may cause a carrier scattering and thus can avoid reduced mobility of the carrier.

Variation of the Third Embodiment of the Present Invention

In the third embodiment mentioned above, since the amount of Si-containing gas to be supplied in the crystal growth step is further reduced, the n-type carrier concentration may be $1\times10^{14}$ to $1\times10^{15}$ at/cm$^3$. In this case, however, the Si concentration in the crystal cannot be measured. Only what can be said at present is that the Si concentration is less than $1\times10^{15}$ at/cm$^3$. Ge may be used in place of Si as an n-type dopant.

Fourth Embodiment of the Present Invention

Next, the fourth embodiment of the present invention will be explained mainly on the difference from the first embodiment.

The GaN-crystal according to this embodiment is similar to the first embodiment in that each concentration of Si, B, and Fe in the crystal is less than $1\times10^{15}$ at/cm$^3$, each concentration of O and C is less than $5\times10^{15}$ at/cm$^3$, but is different from the first embodiment in that it further contains Mg at the concentration of $3\times10^{18}$ at/cm$^3$ or more. Since the GaN-crystal in this embodiment contains Mg at such a concentration, it has conductive property wherein an electric resistivity under a temperature condition of 20° C. or more and 200° C. or less is less than $1\times10^2$ Ωcm, and functions as a so-called p-type semiconductor crystal. The concentration of Mg may be, for example, $3\times10^{18}$ at/cm$^3$ or more and $5\times10^{20}$ at/cm$^3$ or less. In this case, the concentration of the p-type carrier under a temperature condition of 20° C. or more and 200° C. or less is, for example, $2\times10^{17}$/cm$^3$ or more and $5\times10^{18}$/cm$^3$ or less, the electric resistivity under the same temperature conditions is, for example, 0.5 Ωcm or more 100 Ωcm or less.

Mg-containing gas such as Cp$_2$Mg gas may be supplied along with the source gas (GaCl gas+NH$_3$ gas) to the seed crystal substrate 20 to add Mg into the GaN-crystal, in the aforementioned crystal growth step. The partial pressure ratio of Mg-containing gas to group III source gas in the reaction vessel 203 (partial pressure of Mg-containing gas/ partial pressure of total GaCl gas) may be, for example, 1/100,000 to 1/100. Further, in order to add Mg into the GaN-crystal, gas containing magnesium nitride (Mg$_3$N$_2$) or metallic Mg may be used in place of Cp$_2$Mg gas or the like. Regarding these gases, for example, Mg$_3$N$_2$ or metallic Mg may be placed in a high temperature area at about 800° C. in the middle of the gas supply pipe 232c to generate vapor of these materials. Alternatively, the substrate 10 may be obtained in the same manner as in the first embodiment and thereafter Mg ion may be implanted to this substrate 10 to add Mg into the GaN-crystal. Similar to the second embodiment, use of a dopant gas is advantageous in that Mg can be added uniformly across the total area in the direction of thickness of the GaN-crystal, and further, in that it becomes easier to avoid damage posed on the surface of the crystal attributable to the ion implantation described later. It is also advantageous to use ion implantation in that incorporation of the C component included in Cp$_2$Mg gas, that is, increase in the C concentration in the GaN-crystal may be more easily avoided.

Compared to the conventional GaN-crystal containing more impurities, the GaN-crystal obtained according to this embodiment has a better quality since each concentration of Si, B, Fe, O and C in the crystal is extremely small like the GaN-crystal according to the first embodiment. According to this embodiment, since the concentration of impurities such as Si, O in the GaN-crystal is small as described above, a desired conductive property (n-type semiconductor property) may be imparted to the GaN-crystal even when an amount of the Si to be added is suppressed. The GaN-crystal according to this embodiment is more advantageous in that a desired semiconductor property may be imparted while suppressing degradation of crystal resulting from Mg addition as much as possible compared to the conventional GaN-crystal containing more impurities such as Si or O. Further, the GaN-crystal according to this embodiment is more advantageous compared to the conventional GaN-crystal containing more impurities in that it has extremely low concentration of impurities which may cause a carrier scattering and thus can avoid reduced mobility of the carrier.

Other Embodiments of the Present Invention

The embodiments of the present invention have been specifically explained. However, the present invention is not construed to be limited to the aforementioned embodiments, and various changes may be made without departing from the scope of the invention (a) The present invention can be suitably applied to growth of not only GaN, but also, for example, a group-III nitride crystal such as aluminum nitride (AlN), aluminum gallium nitride (AlGaN), indium nitride (InN), indium gallium nitride (InGaN), or aluminum indium gallium nitride (AlInGaN), that is, a crystal represented by the composition formula In$_x$Al$_y$Ga$_{1-x-y}$N (satisfying $0\leq x\leq 1$, $0\leq y\leq 1$, $0\leq x+y\leq 1$).

(b) The crystal growth step of the present invention may include not only the method explained in the aforementioned embodiment but also a combination of the following methods.

For example, since dimension and shape of a gas generator are optimized, stay (contact) time of HCl gas on the Ga melt may be extended (e.g., to 1 minute or more) and the concentration of impurities contained in GaCl gas may be further reduced.

Alternatively, for example, a nano mask, which includes a plurality of micropores having ability to capture impurities formed thereon and contains titanium nitride (TiN), is preformed on a seed crystal substrate, and the GaN-crystal may be grown thereon. Alternatively, for example, when crystal growth is progressed on the seed crystal substrate, a growth period in a facet state rather than on a c-plane, in which state impurity is easily incorporated, can be shortened. As mentioned above, when facet growth is conducted on the seed crystal substrate, it is preferable to obtain the substrate 10 by growing the GaN layer thicker, peeling the resultant from the seed crystal substrate, and removing the crystal which has been grown in a facet state on the heterogeneous substrate side.

According to the methods described in the first to fourth embodiments, such methods can greatly reduce the concentration of impurities in the GaN-crystal alone as described above. In addition, the concentration of impurities in the crystal may be more reliably reduced by using the method in combination with an auxiliary method described herein.

(c) The GaN-crystal obtained according to the present invention is not limited to the case where it is constituted as a substrate, but may be a crystal layer constituting a part of a semiconductor device.

For example, since any one layer of a semi-insulating layer comprising the semi-insulating crystals described in the first and second embodiments, an n-type semiconductor layer comprising the n-type semiconductor crystal described in the third embodiment, and a p-type semiconductor layer comprising the p-type semiconductor crystal described in the fourth embodiment is arbitrarily combined and layered (junction), various semiconductor devices can be fabricated.

Specifically, since a laminate structure including a junction-plane (pn-junction plane) between the p-type semiconductor layer and n-type semiconductor layer mentioned above is fabricated, this laminate structure may be made function as a pn-junction diode. Alternatively, since a laminate structure including a junction-plane (Schottky barrier junction-plane) between either of the p- and n-type semiconductor layers mentioned above and a metal layer containing metal is fabricated, this laminate structure may be made function as a Schottky barrier diode. In order to form the p-type semiconductor layer or the n-type semiconductor layer, as described above, a doping gas may be used to add Si or Mg into the crystal. Alternatively, Si or Mg ion implantation to the semi-insulating layer may be conducted. Alternatively, since Fe or C ion implantation is conducted to the semi-insulating layer, the n-type semiconductor layer, and the p-type semiconductor layer described in the respective embodiments described above, these layers may be made function as an element isolating layer (insulating layer) for inter-elements insulation of the elements formed on the substrate.

EXAMPLES

The experimental results supporting the effect of the embodiments described above will be hereinafter explained. (Temperature Dependency of Electric Resistivity)

Figure 2:
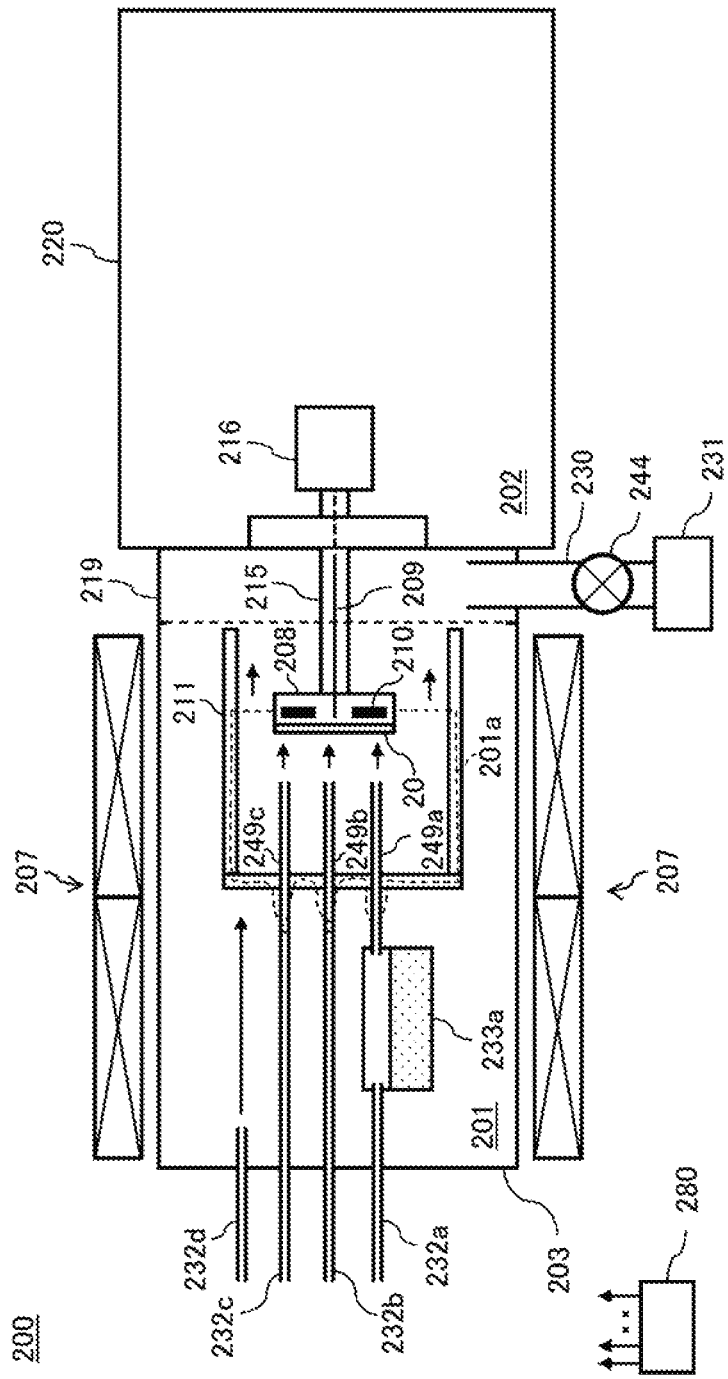
FIG. 2 is a schematic block diagram of a vapor phase growth apparatus, illustrating a state of conducting a step of crystal growth in a reaction vessel.

As samples 1 to 7, the GaN-single crystal was grown to the thickness of 2 mm on a seed crystal substrate comprising a GaN-single crystal using an HVPE apparatus shown in FIG. 2.

In order to confirm effect of impurity removal, a reaction chamber 201 and an exchanging chamber 202 were opened to an atmosphere before growing all of the samples. Thereafter, the high temperature baking step was conducted before the crystal growth step in order to prepare samples 1 to 5. The temperature conditions of the high temperature baking step were 1600° C., 1500° C., 1500° C., 1400° C., 1,100° C. in the order from sample 1 through sample 5. All the pressure conditions were set to 1 atm. Other treatment conditions were within the scope of the treatment conditions described in the first embodiment mentioned above, and common to the samples 1 to 5.

When samples 6 and 7 were prepared, the high temperature baking step was not conducted before the crystal growth step.

In any of samples 1 to 7, the GaN-crystal were grown so that their surfaces became a mirror-surface. However, in samples 4 to 7 which had not been subjected to the high temperature baking at 1500° C. or more, there was a slight crack in the crystal. Regarding samples 1 to 3, there was no crack in the GaN-crystal.

In the crystal growth step to prepare samples 1 and 3 to 5, Fe was not added to the GaN-crystal to be grown on the seed crystal substrate. On the other hand, in the crystal growth step to prepare samples 2, 6, and 7, Fe was added to the GaN-crystal to be grown on the seed crystal substrate. The concentration of Fe in the GaN-crystal in the samples 2, 6, and 7 were $1\times10^{16}$ at/cm$^3$, $1\times10^{18}$ at/cm$^3$, and $1\times10^{19}$ at/cm$^3$, in this order. Other treatment conditions were within the scope of the treatment conditions described in the first embodiment mentioned above, and common to the samples 1 to 7.

Figure 5:
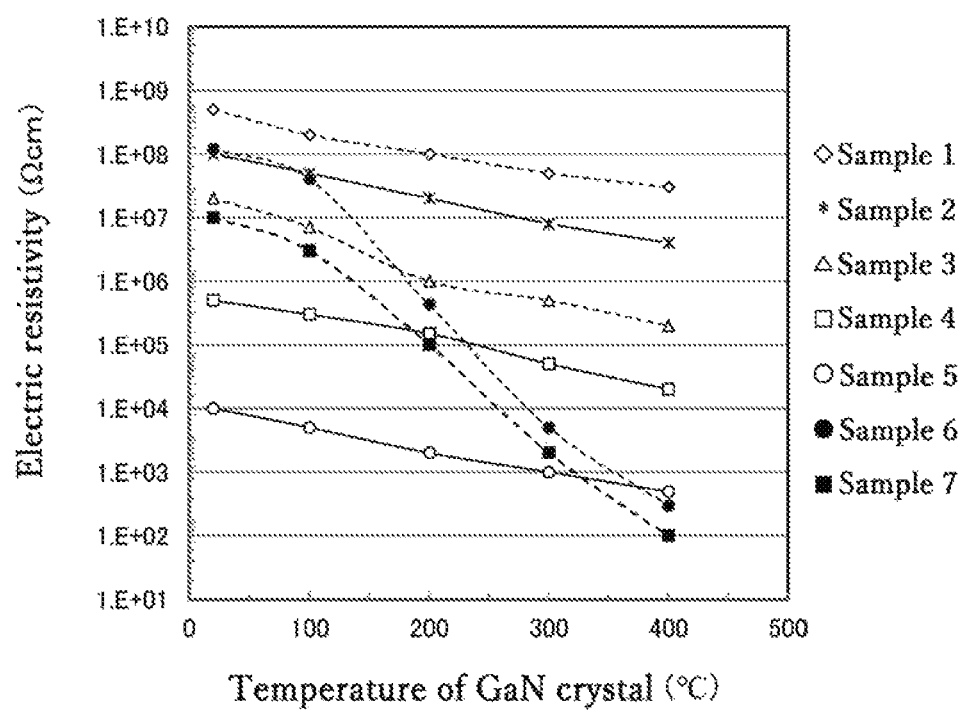
FIG. 5 is a diagram illustrating an evaluation result of electric resistivity of the GaN-crystal.

Next, each GaN crystal of samples 1 to 7 was evaluated for temperature dependency of electric resistivity. The evaluation results are illustrated in FIG. 5. In FIG. 5, the horizontal axis represents temperature (° C.) of the GaN in the measurement of the electric resistivity, and the longitudinal axis represents the electric resistivity (Ωcm) of the GaN crystal. In figure, ◇, *, △, □, ○, ●, and ■, each represents evaluation results of samples 1 through 7 in this order.

As can be seen from FIG. 5, when samples 1 to 5 are compared with each other, the sample whose temperature condition in the high temperature baking step is set to 1500° C. or more (e.g., samples 1 to 3) exhibits higher electric resistivity, that is, higher insulation property under any temperature conditions, compared to the sample whose temperature condition in the high temperature baking step is set to less than 1500° C. This is because since the temperature conditions in the high temperature baking step was set to the aforementioned condition, the concentrations of various impurities contained in the GaN crystal could be respectively reduced.

Moreover, comparison between samples 2 and 3 demonstrates that sample 2 with Fe added thereto exhibits higher insulation property than sample 3 with no Fe added thereto. As can be seen, if the temperature in the high temperature baking step is set to almost the same temperature, addition of Fe at the concentration of $1\times10^{16}$ at/cm3 or more in the GaN crystal may further enhance insulation property. In other words, addition of Fe may provide the same effect as in the case where temperature condition in the high temperature baking step is raised.

In addition, comparison of samples 1 to 5 with samples 6, 7 demonstrates that in samples 1 to 5 which are subjected to the high temperature baking step, an electric resistivity is less likely to be reduced with increasing temperature, that is, has lower temperature dependency, compared to samples 6, 7 which are not been subjected to the high temperature baking step. In samples 6, 7, addition of Fe at the concentration of $1×10^{17}$ at/cm³ or more may be likely to provide reduced insulation property with increasing temperature although the insulation property under low temperature condition may be enhanced. The reason is as described above. On the other hand, samples 1 to 3 whose temperature condition in the high temperature baking step is 1500° C. or more exhibit insulation property similar to or more than insulation property of samples 6, 7. In addition, the insulation property is extremely stable due to its low temperature dependency.

Once released to atmospheric air, repeated crystal growth is continuously conducted without conducting release to atmospheric air between crystal growth as follows: crystal growth→normal baking→crystal growth→normal baking . . . Crystal growth and measurement of electric property as mentioned above were repeated 30 to 50 times, providing almost the same result as described above. Namely, once the high temperature baking step had been conducted, all of the GaN crystals which had been subsequently grown continued to exhibit high electric resistivity unless released to atmospheric air. On the contrary, when the high temperature baking was not conducted after released to atmospheric air, electric resistivity remained low no matter how many times crystal growth and normal baking were repeated. Regarding behavior during Fe doping, it is necessary to dope Fe at high concentration to enhance insulation property when the high temperature dope is not conducted. In that case, electric resistivity is found to exhibit relatively great temperature dependency. On the other hand, it was found that samples 1 to 3 which had been subjected to the high temperature baking step at 1500° C. or more exhibited insulation property similar to or better than those of samples 6, 7, and that insulation property was extremely stable due to its low temperature dependency.

(Temperature Dependency of Concentration of Impurities in High Temperature Baking Step)

Subsequently, as samples 8 to 11, the GaN-single crystal was grown to the thickness of 5 mm on a seed crystal substrate including a GaN-single crystal using the HVPE apparatus shown in FIG. 2. In order to confirm effect of impurity removal, a reaction chamber and an exchanging chamber were opened to an atmosphere before growing all of the samples. Thereafter, the high temperature baking step was conducted before the crystal growth step and growth was conducted without releasing to atmospheric air after the high temperature baking step, for preparation of any of samples. The temperature conditions of the high temperature baking step were 1100° C., 1400° C., 1500° C., 1600° C., in the order from sample 8 to sample 11. Sample 8 corresponds to a sample subjected to the normal baking step rather than the high temperature baking step. All the pressure conditions were set to 1 atm. Other treatment conditions were within the scope of the treatment conditions described in the first embodiment mentioned above, and common to the samples 1 to 8.

Further, regarding sample 12, HVPE device in which the inner wall of the reaction vessel or surfaces of members inside the reaction vessel were coated with PBN (pyrolytic boron nitride) was used to grow the GaN single crystal on the seed crystal substrate. When sample 12 was prepared, the high temperature baking step was not conducted before the crystal growth step.

In any of samples 8 to 12, the GaN-crystal were grown so that their surfaces became a mirror-surface. However, in samples 8 and 9 which had not been subjected to the high temperature baking at 1500° C. or more, there was a slight crack in the crystal. In samples 10 and 11 which had been subjected to the high temperature baking step at 1500° C. or more, there was no crack in the GaN crystal.

In the crystal growth step to prepare samples 8 to 12, impurities such as Fe were not added to the GaN-crystal. Other treatment conditions were within the scope of the treatment conditions described in the first embodiment mentioned above, and common to the samples 8 to 12.

Then, each GaN crystal of samples 8 to 12 was evaluated for the concentration of impurities contained therein using SIMS (secondary ion mass spectrometry). The results are shown in Table 1. The rightmost column in Table 1 indicates the current lower limit of detection using SIMS.

TABLE 1

|  | Sample 8 | Sample 9 | Sample 10 | Sample 11 | Sample 12 | Lower Limit of Detection |
|---|---|---|---|---|---|---|
| Temperature in High Temperature Baking | 1100° C. | 1400° C. | 1500° C. | 1600° C. | n/a | — |
| Concentration of Si (at/cm³) | $2 * 10^{17}$ | $2 * 10^{15}$ | Less than Lower Limit of Detection | Less than Lower Limit of Detection | Less than Lower Limit of Detection | $1 * 10^{15}$ |
| Concentration of B (at/cm³) | Less than Lower Limit of Detection | Less than Lower Limit of Detection | Less than Lower Limit of Detection | Less than Lower Limit of Detection | $2 * 10^{16}$ | $1 * 10^{15}$ |
| Concentration of Fe (at/cm³) | Less than Lower Limit of Detection | Less than Lower Limit of Detection | Less than Lower Limit of Detection | Less than Lower Limit of Detection | Less than Lower Limit of Detection | $1 * 10^{15}$ |
| Concentration of O (at/cm³) | $5 * 10^{16}$ | $1 * 10^{16}$ | Less than Lower Limit of Detection | Less than Lower Limit of Detection | $1 * 10^{16}$ | $5 * 10^{15}$ |
| Concentration of C (at/cm³) | $3 * 10^{16}$ | $8 * 10^{15}$ | Less than Lower Limit of Detection | Less than Lower Limit of Detection | $1 * 10^{16}$ | $5 * 10^{15}$ |

Table 1 demonstrates that the higher the temperature condition in the high temperature baking step, the more the concentration of impurities contained in the GaN crystal tends to be reduced. In addition, it is found that, in samples 10 and 11 in which the temperature condition in the high temperature baking step is set at 1500° C. or more, each concentration of Si, B, and F is less than the lower limit of detection (less than $1\times10^{15}$ at/cm$^3$), and each concentration of O and C is less than the lower limit of detection (lower than $5\times10^{15}$ at/cm$^3$). Moreover, it is found that, in the GaN crystal of sample 12, since the surfaces of the members in the reaction vessel are coated with PBN, the concentrations of impurities such as Si, Fe, C, and O can be respectively reduced, but B is incorporated at the concentration of $2\times10^{16}$ at/cm$^3$. In sample 12, there are a lot of cracks in the grown GaN crystal attributable to the incorporated B.

Once released to atmospheric air, repeated crystal growth is continuously conducted without conducting release to atmospheric air between crystal growth as follows: crystal growth→normal baking→crystal growth→normal baking . . . Crystal growth and measurement of electric property as mentioned above were repeated 30 to 50 times, providing almost the same result as described above. Namely, once the high temperature baking had been conducted, all of the GaN-crystals which had been subsequently grown maintained impurity concentration less than the lower limit of detection unless released to atmospheric air. On the contrary, when the high temperature baking was not conducted after released to atmospheric air, the concentration of impurities never became less than the lower limit of detection no matter how many times crystal growth and normal baking were repeated.

<Preferred Aspect of the Present Invention>

Hereinafter, supplementary descriptions of the preferred aspects of the present invention will be given.

(Supplementary Description 1)

According to an aspect of the present invention, there is provided a semi-insulating crystal, which is the crystal represented by a composition formula $In_xAl_yGa_{1-x-y}N$ (satisfying 0≤x≤1, 0≤y≤1, 0≤x+y≤1), wherein each concentration of Si, B, and Fe in the crystal is less than $1\times10^{15}$ at/cm$^3$, electric resistivity under a temperature condition of 20° C. or more and 200° C. or less is $1\times10^6$ Ωcm or more. More preferably, electric resistivity under a temperature condition of more than 200° C. and 400° C. or less is $1\times10^5$ Ωcm or more.

(Supplementary Description 2)

There is provided the crystal according to supplementary description 1, wherein preferably the concentration of O in the crystal is less than $5\times10^{15}$ at/cm$^3$.

(Supplementary Description 3)

There is provided the crystal according to supplementary description 1 or 2, wherein preferably the concentration of C in the crystal is less than $5\times10^{15}$ at/cm$^3$.

(Supplementary Description 4)

According to another aspect of the present invention, there is provided a semi-insulating crystal, which is the crystal represented by a composition formula $In_xAl_yGa_{1-x-y}N$ (satisfying 0≤x≤1, 0≤y≤1, 0≤x+y≤1), wherein each concentration of Si and B in the crystal is less than $1\times10^{15}$ at/cm$^3$, each concentration of O and C is less than $5\times10^{15}$ at/cm$^3$, the concentration of Fe is $1\times10^{16}$ at/cm$^3$ or more, electric resistivity under a temperature condition of 20° C. or more and 200° C. or less is $1\times10^7$ Ωcm or more. More preferably, electric resistivity under a temperature condition of more than 200° C. and 400° C. or less is $1\times10^6$ Ωcm or more.

(Supplementary Description 5)

There is provided the crystal according to supplementary description 4, wherein preferably the concentration of Fe in the crystal is $1\times10^{16}$ at/cm$^3$ or more and $1\times10^{19}$ at/cm$^3$ or less.

(Supplementary Description 6)

There is provided the crystal according to supplementary description 4 or 5, wherein preferably the electric resistivity under a temperature condition of 20° C. or more and 200° C. or less is $1\times10^8$ Ωcm or more and $5\times10^{10}$ Ωcm or less.

(Supplementary Description 7)

According to another aspect of the present invention, there is provided an n-type semiconductor crystal, which is the crystal represented by a composition formula $In_xAl_yGa_{1-x-y}N$ (satisfying 0≤x≤1, 0≤y≤1, 0≤x+y≤1), wherein each concentration of B and Fe in the crystal is less than $1\times10^{15}$ at/cm$^3$, each concentration of O and C is less than $5\times10^{15}$ at/cm$^3$, concentration of Si is $1\times10^{15}$ at/cm$^3$ or more, electric resistivity under a temperature condition of 20° C. or more and 200° C. or less is $1\times10^2$ Ωcm or less.

(Supplementary Description 8)

There is provided the crystal according to supplementary description 7, wherein preferably the concentration of Si in the crystal is $1\times10^{15}$ at/cm$^3$ or more and $5\times10^{19}$ at/cm$^3$ or less.

(Supplementary Description 9)

There is provided the crystal according to supplementary description 7 or 8, wherein preferably the electric resistivity under the temperature condition of 20° C. or more and 200° C. or less is $1\times10^{-4}$ Ωcm or more and 100 Ωcm or less.

(Supplementary Description 10)

There is provided the crystal according to any one of the supplementary descriptions 7 to 9, wherein preferably the concentration of the n-type carrier under a temperature condition of 20° C. or more and 200° C. or less is $1\times10^{15}/cm^3$ or more and $5\times10^{19}/cm^3$ or less.

(Supplementary Description 11)

According to another aspect of the present invention, there is provided n-type semiconductor crystal, which is the crystal represented by a composition formula $In_xAl_yGa_{1-x-y}N$ (satisfying 0≤x≤1, 0≤y≤1, 0≤x+y≤1), wherein each concentration of Si, B, and Fe in the crystal is less than $1\times10^{15}$ at/cm$^3$, each concentration of O and C is less than $5\times10^{15}$ at/cm$^3$, electric resistivity under a temperature condition of 20° C. or more and 200° C. or less is $1\times10^2$ Ωcm or less.

(Supplementary Description 12)

There is provided the crystal according to supplementary description 11, wherein preferably a concentration of the n-type carrier under the temperature condition of 20° C. or more and 200° C. or less is $1\times10^{14}/cm^3$ or more and less than $1\times10^{15}/cm^3$.

(Supplementary Description 13)

There is provided a p-type semiconductor crystal, which is the crystal represented by a composition formula $In_xAl_yGa_{1-x-y}N$ (satisfying 0≤x≤1, 0≤y≤1, 0≤x+y≤1), wherein each concentration of Si, B, and Fe in the crystal is less than $1\times10^{15}$ at/cm$^3$, each concentration of O and C is less than $5\times10^{15}$ at/cm$^3$, concentration of Mg is $3\times10^{18}$ at/cm$^3$ or more, electric resistivity under a temperature condition of 20° C. or more and 200° C. or less is $1\times10^2$ Ωcm or less.

(Supplementary Description 14)

There is provided the crystal according to supplementary description 13, wherein preferably the concentration of Mg in the crystal is $3\times10^{18}$ at/cm$^3$ or more and $5\times10^{20}$ at/cm$^3$ or less.

(Supplementary Description 15)

There is provided the crystal according to supplementary description 13 or 14, wherein the electric resistivity under the temperature condition of 20° C. or more and 200° C. or less is 0.5 Ωcm or more and 100 Ωcm or less.

(Supplementary Description 16)

There is provided the crystal according to any one of the supplementary descriptions 13 to 15, wherein preferably the concentration of the p-type carrier under the temperature condition of 20° C. or more and 200° C. or less is $2\times10^{17}/cm^3$ or more and $5\times10^{18}/cm^3$ or less.

(Supplementary Description 17)

According to another aspect of the present invention, there is provided a semiconductor device, which is the device having at least one layer of a semi-insulating layer comprising the crystal according to supplementary description 1 or 4, an n-type semiconductor layer comprising the crystal according to supplementary description 7 or 11, and a p-type semiconductor layer comprising the crystal according to supplementary description 13.

(Supplementary Description 18)

There is provided the device according to supplementary description 17, preferably having a junction plane (pn-junction plane) between the p-type semiconductor layer and the n-type semiconductor layer, and serving as a pn-junction diode.

(Supplementary Description 19)

There is provided the device according to supplementary description 17, preferably having a junction plane (Schottky junction plane) between one of the p- and the n-type semiconductor layers and a metallic layer comprising metal, and serving as a Schottky barrier diode.

(Supplementary Description 20)

There is provided the device according to any one of supplementary descriptions 17 to 19, preferably having a layer with a predetermined semiconductor property imparted thereto by Si or Mg ion implantation into the semiconductor layer.

(Supplementary Description 21)

There is provided the device according to any one of supplementary descriptions 17 to 20, preferably having a layer for inter-element insulation by Fe or C ion implantation into the semiconductor layer.

(Supplementary Description 22)

According to another aspect of the present invention, there is provided a planar nitride crystal substrate, which is the substrate comprising the crystal according to supplementary descriptions 1 to 21 and having a thickness of 250 µm or more and a diameter of 25 mm or more.

(Supplementary Description 23)

According to another aspect of the present invention, there is provided a method of manufacturing a nitride crystal, including:

a crystal growth step of loading a seed crystal substrate and raw materials containing a group-III element into a reaction vessel, supplying a halide of the raw material and a nitriding agent to the seed crystal substrate heated to a predetermined crystal growth temperature, and thereby growing a group-III nitride crystal on the seed crystal substrate; and a high temperature baking step of:

raising a temperature of an area in the reaction vessel to 1500° C. or more, the area being heated to at least around the crystal growth temperature, which is a high temperature reaction area not partitioned from the area into which the seed crystal substrate is loaded, and possibly in contact with the gas supplied to the seed crystal substrate;

not conducting supply of the nitriding agent into the reaction vessel, but conducting supply of hydrogen gas and halogen-based gas into the reaction vessel; and cleaning and modifying a surface of a member constituting the high temperature reaction area, wherein the high temperature baking step is conducted before conducting the crystal growth step.

(Supplementary Description 24)

There is provided the method according to supplementary description 23, preferably wherein a member at least a surface of which contains quartz-free and boron-free material is used as the constituting the high temperature reaction area.

(Supplementary Description 25)

The method according to supplementary description 23 or 24, preferably wherein a member at least a surface of which contains at least any one of alumina, silicon carbide, and graphite is used as the member constituting the high temperature reaction area.

(Supplementary Description 26)

The method according to supplementary description 23 or 24, wherein in the high temperature baking step, a pressure in the reaction vessel is maintained at a pressure of 0.5 atm or more and 2 atm or less. Preferably, in the high temperature baking step, the temperature of at least the high temperature reaction area in the reaction vessel is maintained at a temperature of 1500° C. or more. Preferably, the high temperature baking step is conducted while exhausting the reaction vessel. Preferably, the high temperature baking treatment is conducted for 30 minutes or more.

EXPLANATION OF REFERENCE NUMERALS

10 Substrate
20 Seed crystal substrate
21 GaN-crystal film

What is claimed is:

1. A semi-insulating crystal represented by the composition formula $In_xAl_yGa_{1-x-y}N$ (satisfying $0\leq x\leq 1$, $0\leq y\leq 1$, $0\leq x+y\leq 1$), wherein each concentration of Si, B, and Fe in the crystal is less than $1\times10^{15}$ at/cm$^3$, electric resistivity under a temperature condition of 20° C. or more and 200° C. or less is $1\times10^6$ Ωcm or more.

2. The semi-insulating crystal according to claim 1, wherein the concentration of O in the crystal is less than $5\times10^{15}$ at/cm$^3$.

3. The semi-insulating crystal according to claim 1, wherein the concentration of C in the crystal is less than $5\times10^{15}$ at/cm$^3$.

4. A semi-insulating crystal represented by the composition formula $In_xAl_yGa_{1-x-y}N$ (satisfying $0\leq x\leq 1$, $0\leq y\leq 1$, $0\leq x+y\ 1$), wherein each concentration of Si and B in the crystal is less than $1\times10^{15}$ at/cm$^3$, each concentration of O and C is less than $5\times10^{15}$ at/cm$^3$, the concentration of Fe is $1\times10^{16}$ at/cm$^3$ or more, electric resistivity under a temperature condition of 20° C. or more and 200° C. or less is $1\times10^7$ Ωcm or more.

5. An n-type semiconductor crystal represented by the composition formula $In_xAl_yGa_{1-x-y}N$ (satisfying $0\leq x\leq 1$, $0\leq y\leq 1$, $0\leq x+y\leq 1$), wherein each concentration of B and Fe in the crystal is less than $1\times10^{15}$ at/cm$^3$, each concentration of O and C is less than $5\times10^{15}$ at/cm$^3$, concentration of Si is $1\times10^{15}$ at/cm³ or more, electric resistivity under a temperature condition of 20° C. or more and 200° C. or less is $1 \times 10^2$ Ωcm or less.

6. An n-type semiconductor crystal represented by the composition formula $In_xAl_yGa_{1-x-y}N$ (satisfying $0 \leq x \leq 1$, $0 \leq y \leq 1$, $0 \ x+y \leq 1$), wherein each concentration of Si, B, and Fe in the crystal is less than $1 \times 10^{15}$ at/cm³, each concentration of O and C is less than $5 \times 10^{15}$ at/cm³, electric resistivity under a temperature condition of 20° C. or more and 200° C. or less is $1 \times 10^2$ Ωcm or less.

7. A p-type semiconductor crystal represented by the composition formula $In_xAl_yGa_{1-x-y}N$ (satisfying $0 \leq x \leq 1$, $0 \leq y \leq 1$, $0 \leq x+y \leq 1$), wherein each concentration of Si, B, and Fe in the crystal is less than $1 \times 10^{15}$ at/cm³, each concentration of O and C is less than $5 \times 10^{15}$ at/cm³, concentration of Mg is $3 \times 10^{18}$ at/cm³ or more, electric resistivity under a temperature condition of 20° C. or more and 200° C. or less is $1 \times 10^2$ Ωcm or less.

* * * * *

UNITED STATES PATENT AND TRADEMARK OFFICE
CERTIFICATE OF CORRECTION

PATENT NO. : 10,978,294 B2
APPLICATION NO. : 16/344118
DATED : April 13, 2021
INVENTOR(S) : Hajime Fujikura Page 1 of 1

It is certified that error appears in the above-identified patent and that said Letters Patent is hereby corrected as shown below:

In the Claims

In Column 24, Lines 42-43, at the beginning of Claim 1, "0 x+y≤1)," should read -- 0≤x+y≤1), --

In Column 24, Line 56, at the beginning of Claim 4, "0≤x+y 1)," should read -- 0≤x+y≤1), --

In Column 25, Line 6, at the beginning of Claim 6, "0≤y≤1, 0 x+y≤1)," should read -- 0≤y≤1, 0≤x+y≤1), --

Signed and Sealed this
Fifth Day of October, 2021

Drew Hirshfeld
*Performing the Functions and Duties of the*
*Under Secretary of Commerce for Intellectual Property and*
*Director of the United States Patent and Trademark Office*